(12) United States Patent
Chiba et al.

(10) Patent No.: US 6,219,820 B1
(45) Date of Patent: Apr. 17, 2001

(54) PRINTED CIRCUIT BOARD DESIGN DEVICE

(75) Inventors: Norimichi Chiba, Hino; Takashi Amano, Souka; Satoshi Arai, Musashino; Manabu Ishibe, Hachioji; Mikio Hayashihara, Sagamihara, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/020,405

(22) Filed: Feb. 9, 1998

(30) Foreign Application Priority Data

Feb. 10, 1997 (JP) .................................... 9-026310

(51) Int. Cl.[7] .................................................. G06F 15/40
(52) U.S. Cl. ................................................................ 716/5
(58) Field of Search ........................ 395/500.03, 500.02; 345/507; 703/15

(56) References Cited

U.S. PATENT DOCUMENTS 5,371,851 * 12/1994 Pieper .................................. 345/507
5,898,595 * 4/1999 Bair ................................... 395/500.03
5,999,726 * 12/1999 Ho .................................... 395/500.02

FOREIGN PATENT DOCUMENTS 4-070973 3/1992 (JP) .
4-205471 7/1992 (JP) .

* cited by examiner

Primary Examiner—Matthew Smith
Assistant Examiner—Thuan Do
(74) Attorney, Agent, or Firm—Finnegan, Henderson, Farabow, Garrett & Dunner, L.L.P.

(57) ABSTRACT

In a design of the printed circuit board design device, a signal wire name is affixed to each wiring of a circuit, thereby making it quite easy to go through confirmation works after the design works are thoroughly accomplished. The present invention aims at improving efficiency of works for affixing the signal wire name. For this purpose, the signal wire names are input for each desired area of the circuit. By taking full advantage of overlap of the area concerned, the signal wire names connected in serial form are affixed to one wiring. The candidates of the signal wire names to be affixed are tabulated as a list. After the signal wire names are affixed to each wiring of the circuit, the wiring can be retrieved and shown in visible display. In this case too, the candidates of the signal wire names to be retrieved can be tabulated as a list.

33 Claims, 10 Drawing Sheets

AFFIXING OF ATTRIBUTE (1)

FIG.4B

AFFIXING OF ATTRIBUTE (3)

FIG.4C

AFFIXING OF ATTRIBUTE (2)

FIG.4D

AFFIXING OF ATTRIBUTE (4)

| AAA | BBB | CCC |
|---|---|---|
| ATTRIBUTE 1 | ATTRIBUTE 2 | ATTRIBUTE 3 |

FIG.5B

| AAA , | BBB , | CCC , |
|---|---|---|
| ATTRIBUTE 1 | ATTRIBUTE 2 | ATTRIBUTE 3 |

FIG.5C

| Aaa | Bbb | Ccc |
|---|---|---|
| ATTRIBUTE 1 | ATTRIBUTE 2 | ATTRIBUTE 3 |

FIG.5D

| aaA | bbB | ccC |
|---|---|---|
| ATTRIBUTE 1 | ATTRIBUTE 2 | ATTRIBUTE 3 |

FIG.5E

| AA1 | BB1 | CC1 |
|---|---|---|
| ATTRIBUTE 1 | ATTRIBUTE 2 | ATTRIBUTE 3 |

FIG.5F

| 1AA | 1BB | 1CC |
|---|---|---|
| ATTRIBUTE 1 | ATTRIBUTE 2 | ATTRIBUTE 3 |

| AAA | BBB | CCC |
|---|---|---|
| ATTRIBUTE 1 | ATTRIBUTE 2 | ATTRIBUTE 3 |

PRINTED CIRCUIT BOARD DESIGN DEVICE

FIELD OF THE INVENTION

The present invention relates to a printed circuit board design device used for an electronic equipment, or the like.

DESCRIPTION OF THE PRIOR ART

For the purpose of confirming presence or non-presence of an inappropriate wiring (for example, a proximity of wirings in radio circuit of radio equipment, or the like) or correcting the inappropriate wiring, it is often practiced until now that a signal wire name is affixed to each wiring in the printed circuit board design.

For example, in Japanese Patent Application Laid-open No. 205471/1992, is disclosed that when a signal wire name is to be affixed to the wiring of a circuit of a designed printed circuit board or to be corrected, the signal name affixed so far is retrieved and displayed in a menu form in order to reduce a time and labor required for inputting the same name over and over again and, by designating the signal wire name thus displayed, an input mistake is reduced.

Again, in Japanese Patent Application Laid-open No. 70973/1992, a device is disclosed wherein a retrieving is made by the signal wire name of a wiring to be confirmed and even when a signal wire affixed with a desired signal wire name is disposed on a plurality of drawings, there is no need to confirm the signal wire name by every drawing. Hence, its workability is enhanced.

However, the signal wire name input by the designer while designing a circuit is input or selected by the designer himself each time and, for this reason, the signal wire naming becomes irregular and irresponsible and a trouble arises where no distinction can be made among similar signal wire names affixed. Also, when one wiring belongs to more than two kinds of circuits, a trouble arises where the corresponding relation with the circuit is not clear because there is no device available which can properly affix a signal wire name.

Also, if the designation of a signal wire name is not appropriate when a circuit is confirmed, a retrieving omission occurs or the designation of a signal wire name becomes complex and a lot of time and labor is spent in the operation.

SUMMARY OF THE INVENTION

This invention is made in order to solve the above troubles. It is an object of the present invention to offer a printed circuit board design device which can easily and speedily make a proper naming for a wiring. Also, it is another object of the present invention to offer the printed circuit board design device which can easily and speedily make a proper naming for the wiring even when one wiring comprising a circuit of the printed circuit board belongs to more than two kinds of circuits.

The printed circuit board design device of the present invention comprises a wiring selection means for selecting one or more than two wiring in the circuit displayed with a layout, an input means for inputting an attribute information showing to the selected wiring said wiring belongs to which function of the circuit and a signal wire name adding means wherein, when a plurality of the attribute information are input into one wiring, each of the attribute information is connected in series and made into a signal wire name for said one wiring, and wherein the signal wire name precisely showing that one wiring belongs to several kinds of attribute is given to said one wiring.

The data related to the wiring inside the input layout data and the data of the affixed signal wire name are made to correspond to each other and memorized.

The printed circuit board design device of the present invention has a candidate group of the attributes information which is kept in memory in advance and which is attached to the wiring comprising a circuit of the printed circuit board. It displays said group of the attribute information and selects a desired attribute information from the displayed group of the attribute information, thereby helping the designer to affix a proper signal wire name to the wiring.

The printed circuit board design device of the present invention comprises an input means for inputting the attribute information of the wiring to be retrieved in the displayed circuit, a retrieving means for retrieving the wire affixed with a signal wire name including at least in part said information input as above, and a retrieving result display control means for displaying a retrieving result in said display means. As a result, the wiring displayed in a circuit can be confirmed if it is made into a proper circuit by retrieving on the basis of the attribute information.

In the printed circuit board design device of the present invention, the attribute information candidate group information of the wiring to be retrieved in the circuit displayed is memorized in advance and by displaying the attribute information of the candidate group and the attribute information to be retrieved from the displayed candidate group is selected, thereby a proper attribute information can be input at the time of retrieving.

DETAILED DESCRIPTION OF THE INVENTION

Figure 1:
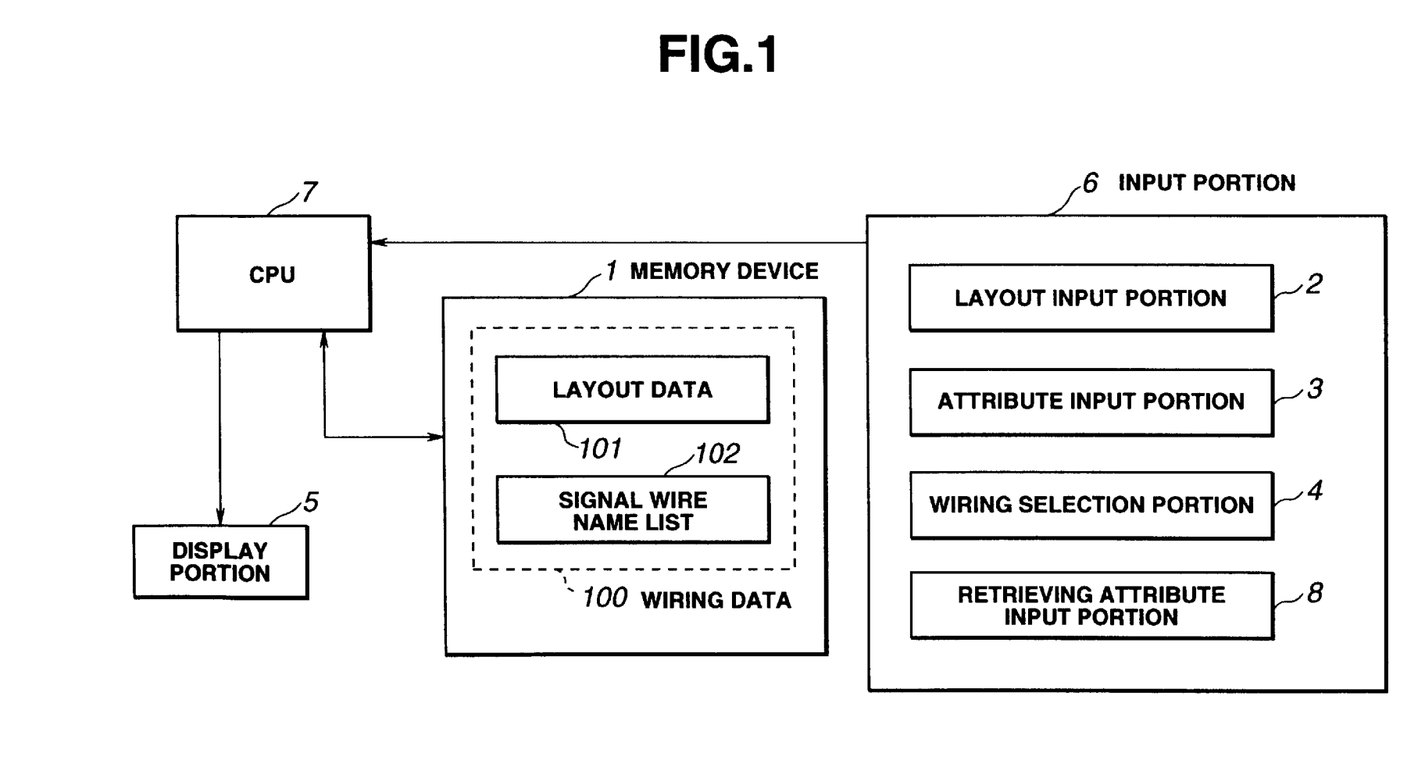
FIG. 1 is a block diagram, showing a first embodiment of a printed circuit board design device of the present invention.

FIG. 1 is a block diagram, showing a first embodiment of a printed circuit board design device of the present invention. The printed circuit board design device comprises memory device 1, input portion 6, CPU 7 and display portion 5. Layout input portion 2, attribute input portion 3, wiring selecting portion 4 and retrieved attribute input portion 8 are included in input portion 8. Layout data 101 and wiring data 100 composed of signal wire name list 102 are memorized in memory device 1 comprising HDD, etc. Layout data 101 is a data for displaying the wiring and circuits as shown in, for example, diagrams 3, 4, 8~10. Signal wire name list 102 makes a signal wire names correspond to data related to the wiring in the layout data. Layout data 101 input by layout input portion 2 is memorized in CPU 7. Various information such as a layout of printed circuit board based on wiring data 100 of a designed circuit, etc. are displayed in display portion 5 under control of CPU 7. Wiring selecting portion 4 is used for designating and selecting individually or by area the wiring on the point of affixing signal wire names on a layout screen displayed in display portion 5. Attribute input portion 3 is used for inputting the attribute information which should be affixed to the wiring in a selected area or the wiring selected by wiring selecting portion 4. CPU 7 treats said attribute information as signal wire names and makes them correspond with data related to the wiring in the layout data and memorize them in signal wire name list 102. Retrieving attribute input portion 8 is used for inputting in CPU 7 one or a plurality of attribute information when retrieving. CPU 7 summarizes and controls each portion on the basis of a program or data and particularly it retrieves from signal wire name list 102 the wiring having the attribute information input by retrieving attribute input portion 8. Also, CPU 7 makes an exaggeration display of the retrieved wiring as above in display portion 5.

In the present specification, attribute means which portion of a circuit the wiring belongs to or what kind of the circuit it is. For example, when a name of "RX" is affixed to the wiring of a radio receiving portion, the RX means that it is the wiring of the radio receiving portion. Also, when a name of "TX" is affixed to the wiring of a radio transmitting portion in the printed circuit board, the TX means that it is the wiring of the radio transmitting portion. In the present invention, when one or more than two attribute is affixed to the wiring, the one or more than two attribute becomes the signal wire name of the wiring. And, by the signal wire name affixed to the wiring, the attribute information can be obtained as to which circuit said wiring belongs to.

Figure 2:
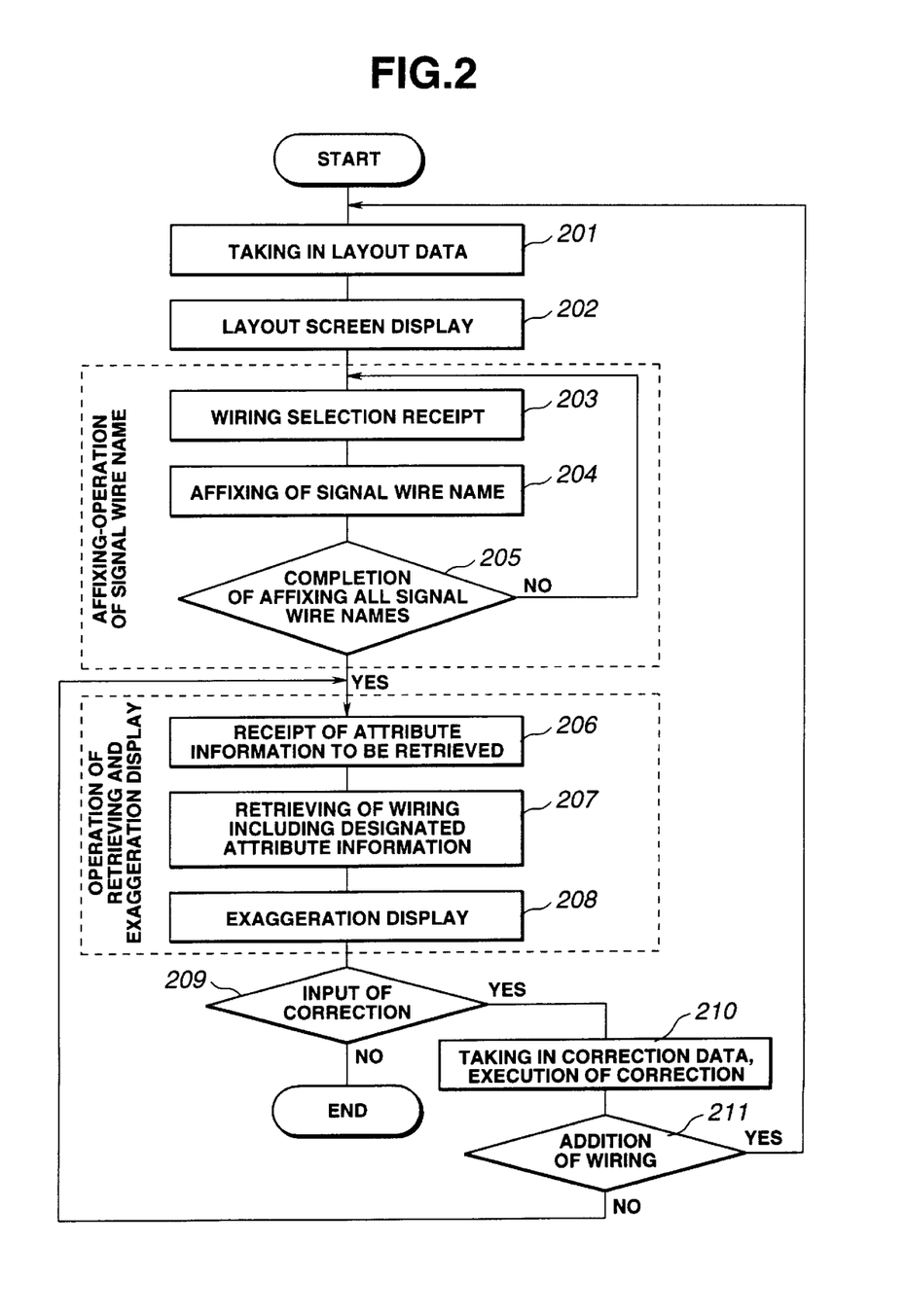
FIG. 2 is a flow chart, showing an operation of the printed circuit board design device according to a first embodiment.

The printed circuit board design device as shown in FIG. 1 is materialized by various kinds of computers such as, for example, office computer, personal computer, etc. and then CPU 7 of the computer performs a program corresponding to the flow chart as shown in FIG. 2, a process as the printed circuit board design device is performed.

Next, the operation of the present embodiments will be described with reference to the flow chart as shown in FIG. 2. First, layout data 101 is input from layout inputting portion 102 by a designer and it is taken in by CPU 7 (step 201). Layout data 101 thus input is memorized by CPU 7 in memory device 1. While, CPU 7 displays a layout screen in display portion 5 on the basis of layout data 101 as input above (step 202). Next, the designer selects on the layout screen the wiring to be affixed with a signal wire name by wiring selection portion 4 and CPU 7 accepts the information of the selected wiring (step 203). In this case, it is alright for designation of the wiring to use a pointing device such as a mouse etc. for individual wiring or a plurality of wiring and when be wants that an identical name is affixed to a plurality of wiring, he may perform an input by designating the area which includes a plurality of these wiring.

When wiring selection ends, next a program for affixing the signal wire name is activated. The designer inputs in character the attribute information regarding the selected wiring or the area which includes a plurality of the wiring and he can perform naming for an individual wiring or a plurality of the wiring in the area. CPU 7 takes in an input of the attribute information regarding the wiring, makes it correspond to the information of the selected wiring and memorizes it in memory device 1 (step 204). Also, the above attribute information is displayed in the layout screen, for example, close by the corresponding wiring, as the signal wire name which is affixed to the above selected wiring.

Figure 3A:
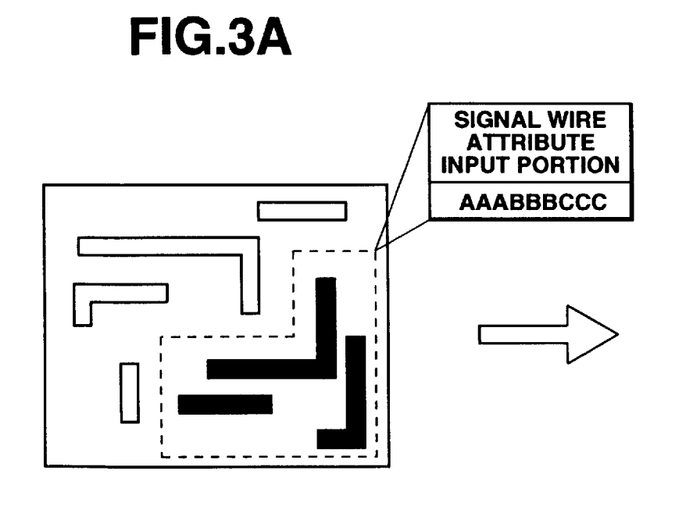
FIGS. 3A–3B is a diagram, describing an identification data automatic affixing operation of the printed circuit board design device according to a first embodiment.
Figure 3B:
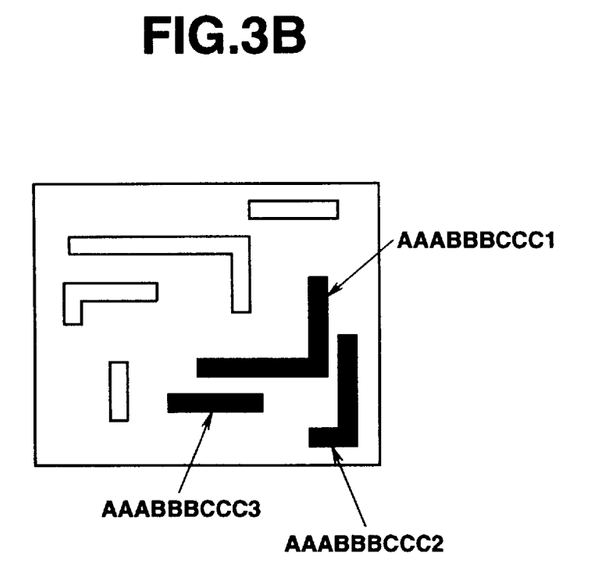

In the case that an identical name is affixed to a plurality of the wiring when affixing the above signal wire name, CPU 7 is capable of automatically affixing identification data which can identify those names. For example, in the layout screen as shown in FIG. 3(A), an extent of the wiring as shown by a broken line is selected. When a signal wire name (AAABBBCCC) comprising an identical attribute information is affixed, the identification data such as 1, 2 and 3 as shown in FIG. 3(B) are automatically affixed to the last of each signal wire name and the signal wire name of each wiring is thus distinguished.

As a result of affixing the signal wire name by this manner, the attribute information taken by step 204 is affixed to the information about the selected wiring received by step 203 and a relevant portion in signal wire name list 102 is modified. The process from step 203 to step 204 is repeated until an input is made indicating that affixing of all signal wire names is completed (step 205).

Figures 4A, 4B:
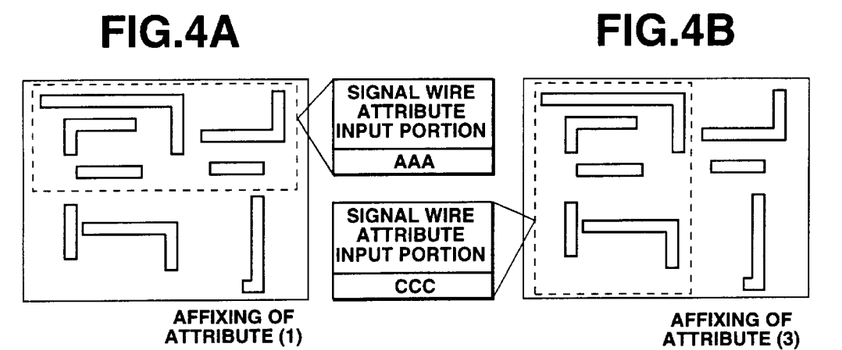
FIG. 4A–4E is a diagram, describing an operation for affixing a plurality of signal wire names to one wiring in the printed circuit board device according to a first embodiment.
Figures 4C, 4D:
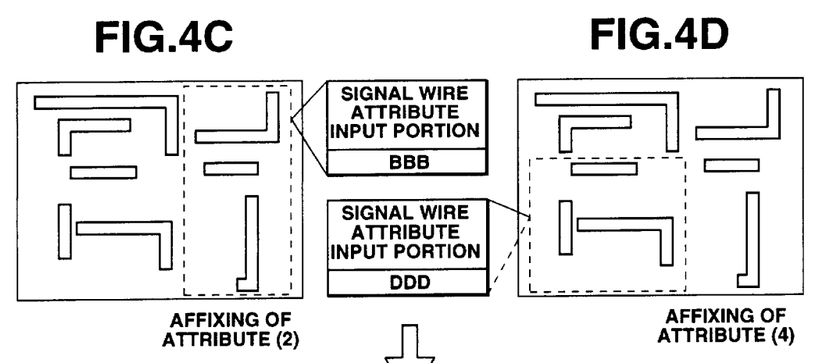
Figure 4E:
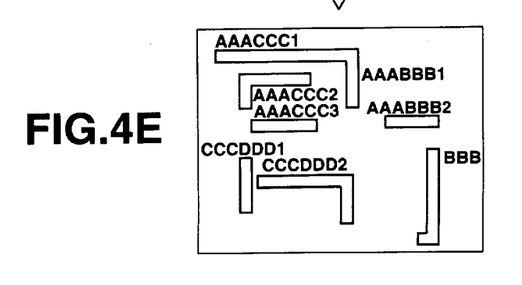

To put it concretely, as shown in FIG. 4(A) to 4(D), the wiring included in the area shown by a broken line in the layout screen is selected and the attribute information is input to the wiring in this area respectively. Here, a portion of the wiring which is input in time-sequence with a plurality of the attribute information goes through a process of the signal wire name affixing. For example, when the attribute information AAA is affixed to the wiring within the broken line of FIG. 4 (A) first and then the attribute information CCC is affixed to the wiring within the broken line of FIG. 4 (B), the signal wire name comprising the attribute information AAACCC1~AAACCC3 as shown in FIG. 4(E) is affixed to the wiring of the overlapping portion of the above area. Here, a numeral of the signal wire name is the identification data. Further, each attribute information in the signal wire name to be affixed is disposed in serial in inputting order or in a fixed order (for example, in alphabetical order).

Next, the process of retrieving a required wiring by the attribute information and the process of performing an exaggeration display of the wiring resulted from the retrieving will be described as follows. The designer inputs one or a plurality of the attribute information to be retrieved by retrieved attribute input portion 8 and notifies to CPU 7 of the information and CPU 7 accept it (step 206). CPU 7 compares the attribute information comprising the signal wire names collected by signal wire name list 102 in memory device 1 with the attribute information designated by stop 206 and extracts the specified attribute information as above from signal wire name list 102 (step 207). Further, in CPU 7, a program related to the wiring exaggeration display control is activated and the exaggeration display of the retrieved wiring is made on the layout screen of display portion 5 (step 208). Here, the exaggeration display is a process where a thickness of the wiring displayed is made thicker than the thickness of other wiring. In place of the exaggeration display, a process is adapted where a display mode of the wiring related to the result of retrieving such as a reversal display in black and white, blinking, a display in a broken line, etc. are differentiated from a display mode of other wiring. Also, in the case of exaggeration display, etc., the signal wire name of the wiring where the exaggeration display ,etc. are made can be displayed close by the wiring.

By taking a look at the wiring in the layout made of the exaggeration display, the designer can, for example, confirm connections and effectively perform checking a proximity degree of inter-wiring which is required to avoid interference, etc. As a result, since an input of a correction is made when a layout required to be corrected is discovered, the printed circuit board design device keeps watch over it (step 209). When the input of the correction is made, CPU 7 takes in a data related to the correction, makes a corresponding correction (step 210) and detects if a wiring addition is made (step 211). When a wiring is added, it returns to step 201 which takes in the layout data including the added layout data and affixes a signal wire name to the wiring related to the addition through the process on and after step 201. While, when a wiring is not added, it returns to step 206 and performs its operation. If there is no layout available which requires a correction and no input of a correction is made, the layout design ends.

In the above described process, the designer confirms connections, performs checking a proximity degree of inter-wiring which is required to avoid interference, etc. and performs inputting of the correction. However, if the data related to the proximity degree of inter-wiring which is required to avoid interference and the information regarding the wire which tends to cause other troubles are put into the printed circuit board design device as a data base and said data base is compared to the layout data of the printed circuit board prepared by the flow chart as shown in FIG. 2 and they tally with each other, the exaggeration display is made so that a correction by the designer. can be demanded. Further, by affixing a data (data on how far the space between the wiring should be kept apart) of a counter method to the data base of said troubles, automatic correction of applicable data can be made in place of the designer.

In the case that a plurality of the property information is included in the signal wire name of one wiring when affixing a name to the wiring as above, it is convenient if the boundary of each attribute information comprising the signal wire name is made clear and accurate for improving efficiency of the retrieving process. For such a case, the printed circuit board design device of the present invention has a constitution which establishes a clear-cut boundary of each attribute information comprising the signal wire name and therefore this constitution will be described in details as follows.

Figure 5A:
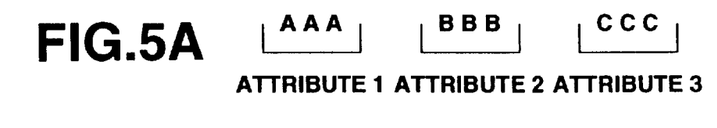
FIG. 5A–5F is a diagram, describing an operation for clearly establishing boundary between each attribute information when a plurality of attribute information is affixed to one wiring in the printed circuit board design of the present invention.
Figure 5B:
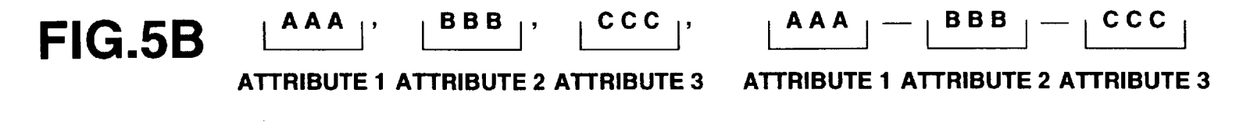
Figure 5C:
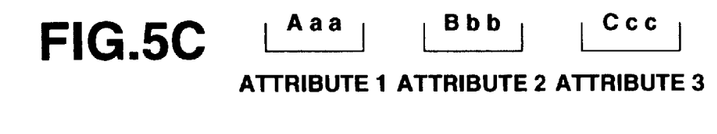
Figure 5D:
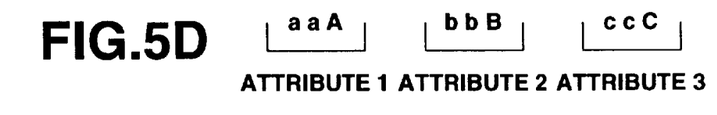
Figure 5E:
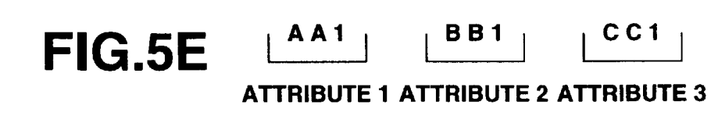
Figure 5F:
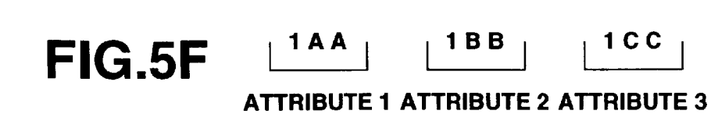

By limiting in advance a number of characters of one attribute information or by deciding any time a number of characters of one attribute information, a boundary of each attribute information can be made clear and accurate as shown in FIG. 5(A). In the example as shown in FIG. 5(A), one attribute information is limited to three characters. Also, as shown in FIG. 5(B), a method of using punctuation marks such as, "comma", "hypen", etc. between each attribute information can be adapted. Also, as shown in FIG. 5(C), a rule is adapted where characters other than the first character should be alphabet of small letters and the first one character alone should be alphabet of a capital letter. Not only that, as shown in FIG. 5(D), a method can be used where characters other than the last one character are alphabet of a capital letter. Also, as shown in FIG. 5(E), a method can be used where characters other than the last character are characters other than an numeral, for example, alphabet and the last character alone is a numeral. Again, as shown in FIG. 5(F), characters other than the first one character are alphabet and the first character alone is a character other than an alphabet, for example, a numeral, etc.

Although from among the means of giving punctuation to the space between the attribute information, the designer may be allowed to choose a manual input operation, CPU 7 inserts a punctuation mark [-] into the attribute information affixed to the wiring, for example, such as AAABBB and automatically makes a signal wire name AAA–BBB.

According to the present embodiment, even when one wiring comprising the printed circuit board belongs to more than two kinds of attribute (circuit), a proper naming can easily and speedily by made. Further, when an identical signal wire name is affixed to a plurality of the wiring, the identification data to identify these names is automatically attached to the signal wire and each wiring can be distinguished. Further, since the signal wire name of the wiring having more two attributes are affixed with a punctuation of the attribute information clearly indicated, retrieving of such wiring can easily and precisely be made. Accordingly, the efficiency of confirming presence or non-presence of inappropriate wiring or its correction works during designing the printed circuit board or after the end of designing the printed circuit board can be further enhanced and a lead-time till the completion of the printed circuit board can be shortened.

Figure 6:
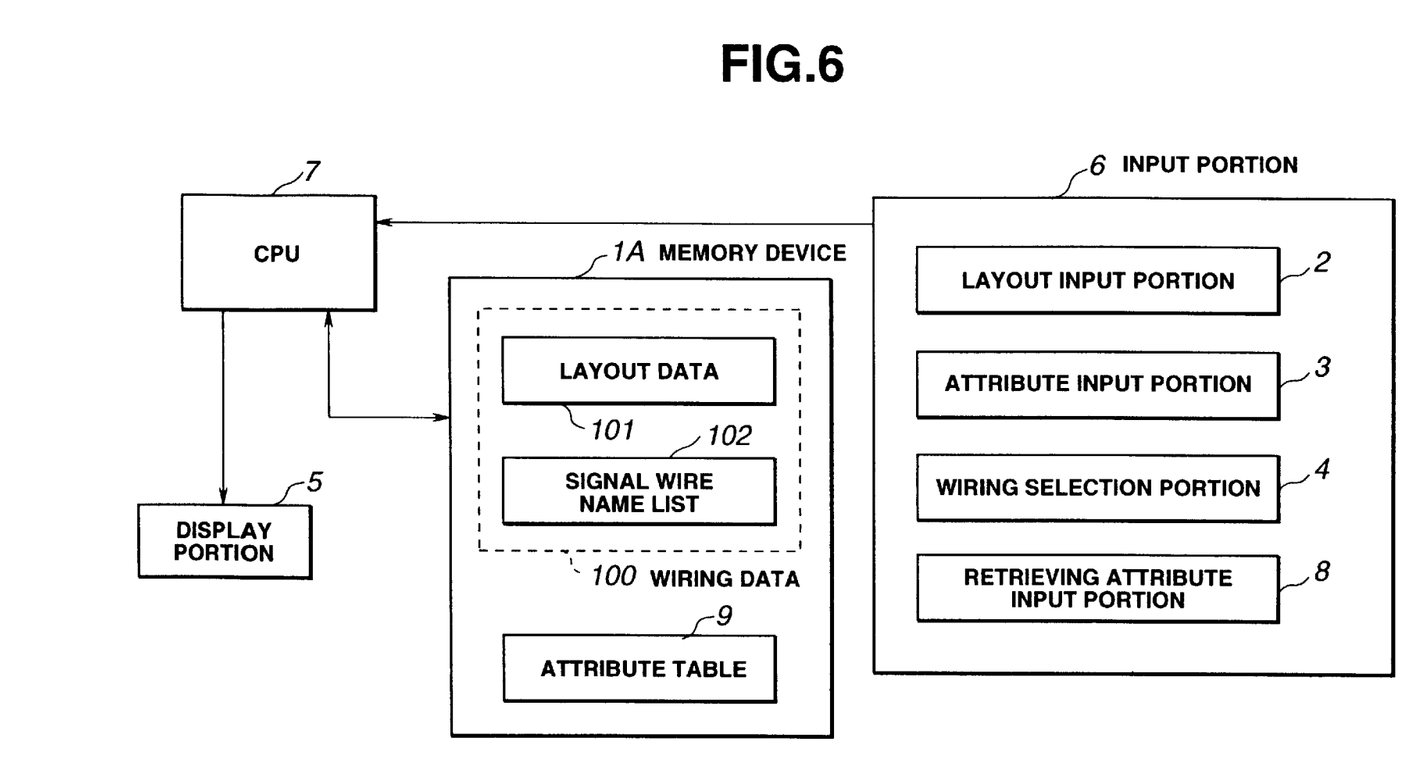
FIG. 6 is a block diagram, showing a second embodiment of the printed circuit board design device of the present invention.

FIG. 6 is a block diagram, showing a second embodiment if the printed circuit board design device of the present invention. The printed circuit board design device according to a second embodiment provides memory device 1A with attribute table 9 which memorizes as a table a candidate group of the attribute information to be attached to the wiring and a candidate group of the attribute information to be designated when retrieving is made after a signal wire name is affixed. Except for this point, the constitution of the printed circuit board design device according to a second embodiment is identical with the constitution of the printed circuit board design device according to a first embodiment as shown in FIG. 1.

Figure 7:
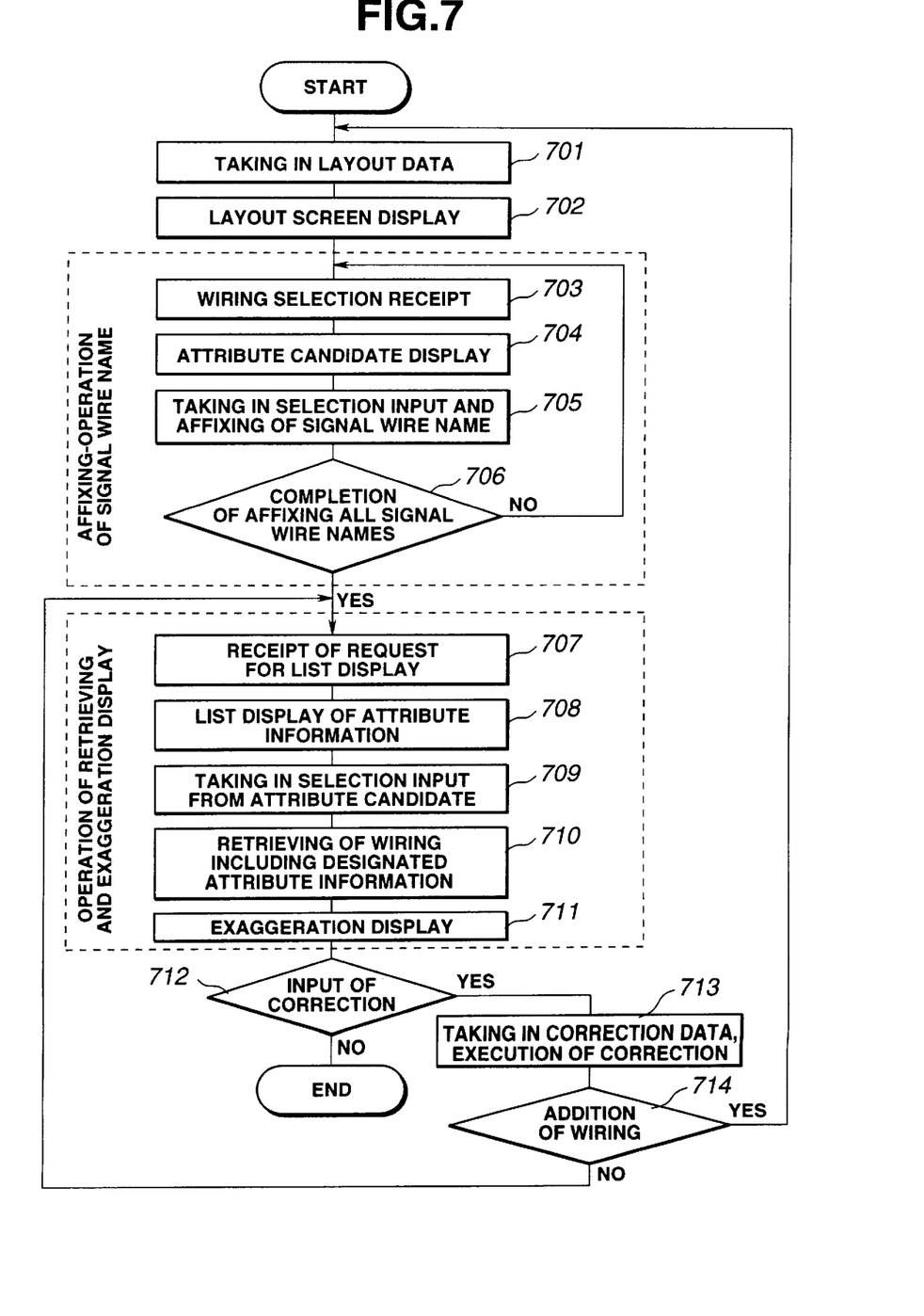
FIG. 7 is flow chart, showing an operation of the printed circuit board design device according to a second embodiment.

The printed circuit board design device as shown in the above FIG. 6 is also materialized by various kinds of computers such as, for example, office computer, personal computer, etc. and when CPU 7 of the computer runs program corresponding to the flow chart as shown in FIG. 7, a process as the printed circuit board design device is performed.

Next, the operation of this embodiment will be described as follows with reference to the flow chart of FIG. 7. First, layout data 101 is input by the designer from layout input portion 2 and CPU 7 takes this data (step 701). By this operation, layout data 101 thus input is memorized by CPU 7 in memory device 1. While, CPU 7 displays a layout screen in display portion 5 on the basis of the layout data input as above (step 702). Next, the designer selects on the layout screen by wiring selecting portion 4 the wiring to be affixed with a signal wire name and CPU 7 accepts the information of the selected wiring (703). When selection of the wiring is performed, CPU 7 reads out the attribute information from attribute table 9 and displays it in display portion 5 as a list (step 704).

Following the above, the designer selects the wiring selected as above or the attribute information to be affixed to the wiring including an area. In CPU 7, a program of affixing the signal wire name is activated and it accepts the selected attribute information, makes the above selected attribute information correspond to the wiring individually designated or the wiring within the designated area and affixes it as a signal wire name (step 705). Further, the signal wire name including the affixed attribute information is displayed in the layout screen, for example, close by the corresponding wire. As a result of affixing the signal wire name in such manner, the attribute information selected from among the above attribute information group is affixed to the selected wiring received by step 703 and the applicable portion in signal wire name list 102 is modified. And the process from step 703 to 705 are repeated until the input is made to complete affixing all signal wire names (step 706).

Next, a process of retrieving the required wiring by the attribute information and a process of performing an exaggeration display of the wiring resulted from retrieving will be described as follows. The designer inputs to obtain by retrieving attribute input portion 8 for inputting the attribute information. CPU 7 accepts the (list display) (step 707) and, by responding to this operation, reads out the attribute information from attribute table 9 and displays the list in display portion 5 (step 708). Then, the designer selects and inputs one or a plurality of the attribute information which he wants to retrieve from the list display and notifies it to CPU 7 and CPU 7 takes it (step 709). CPU 7 compares the attribute information in the signal wire name collected in signal wire name list 102 of memory device 1 with the attribute information designated by step 709 and extracts the wiring including the attribute information designated as above from signal wire name list 102 (step 710). Following the above, CPU 7 controls display portion 5 on the basis of a list of the extracted wiring and displays in exaggeration on the layout screen of display portion 5 the wiring extracted by step 710 (step 711). it is alright if the exaggeration display will differentiate a display mode of the wiring resulted from retrieving and other wiring as already described. Also, in the case of the exaggeration display, etc., the signal wire name of the wiring displayed in exaggeration, etc. can be displayed close by the wiring.

By looking at the wiring in the layout which is displayed in exaggeration in step 711, the designer can effectively perform, for example, confirming connections, checking a proximity of the inter-wiring which he wants to avoid from interfering with each other, etc. As a result, when the layout necessary to be corrected is found out, he makes an input of a correction and the printed circuit board design device keeps watch over it (step 712). When the input of the correction is made, the printed circuit board design device takes in the data related to the correction and makes a corresponding correction (step 713). Then, it is detected if the addition of the wiring is made or not (step 714). When the addition of the wiring is made, the printed circuit board design device returns to step 701 and affixes a signal wire name to the wiring related to the addition by the process on and after step 701. While, when the addition of the wiring is not made, it returns to step 707 and performs its process. If there is no layout requiring a correction nor any input of a correction available, the layout design ends.

Figure 8A:
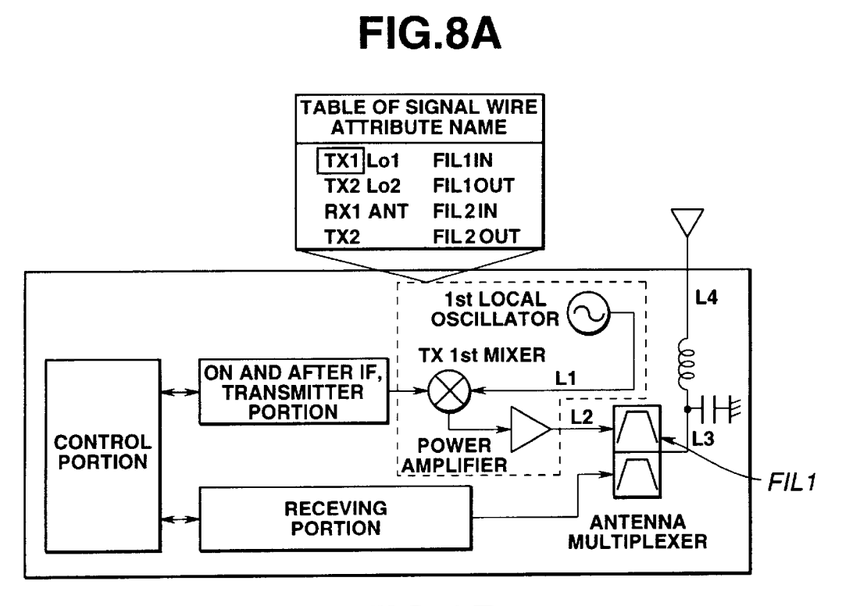
FIG. 8A–8B is a diagram, showing a process of affixing a signal wire name to the printed circuit board for radio by the printed circuit board design device according to a second embodiment and one example of a process of making an exaggeration display of the wiring having the designated attribute information
Figure 8B:
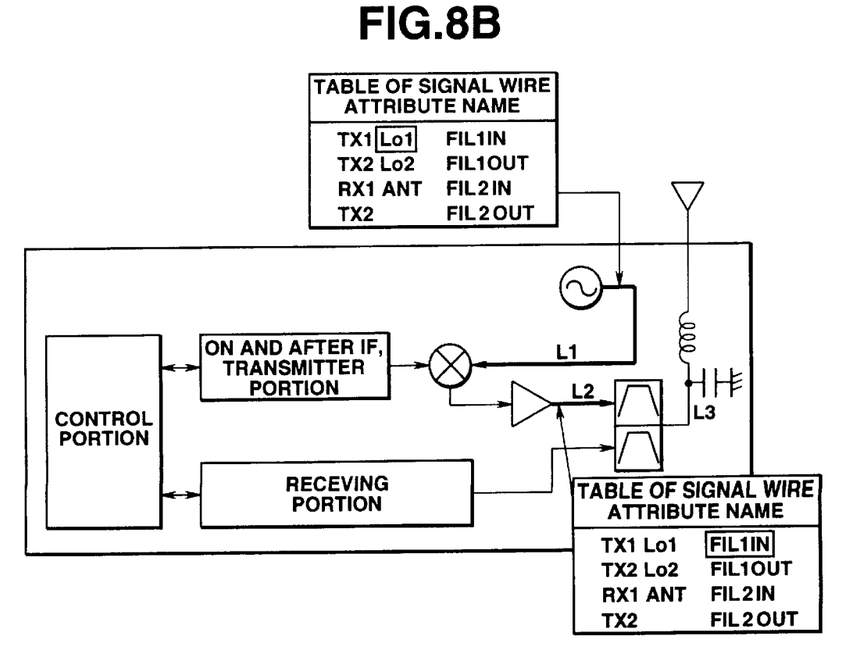

Next, by using a concrete example, the operation will be described as follows. FIG. 8 is a diagram, showing a process of displaying in exaggeration of the wiring where the attribute information related to the wiring of a radio printed circuit board is input and a signal wire name is affixed and furthermore the designated attribute information is available. Here, affixing a signal wire name is described by citing an example where a special attention is paid to two kinds of interfering wiring which have to be avoided on the radio printed circuit board as follows: interference between input wiring and output wiring of a filter has to be avoided and interference between the wiring of transmitter first local oscillator and the wiring of an antenna has to be avoided.

Further, the attribute information constituting signal wire names to be used in the present description will be also described. The wiring where an input signal to an antenna flows is treated as "ANT" and a transmitter RF portion as "TXI", while on a filter shown in FILI in the diagram, its input is treated as "FILIN" and its output as "FILIOUT". Also, on boundary between the attribute information in the above individual signal wire names, description of a case will be made as an example where a hyphen (-) is used as a punctuation mark.

Figure 9A:
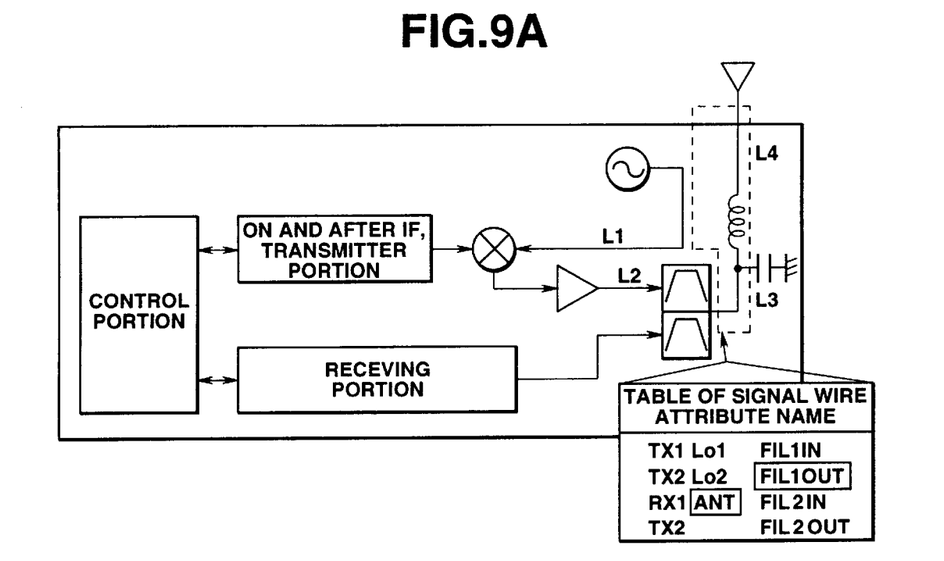
FIG. 9A–9B is a diagram, showing a process of affixing a signal wire name to the printed circuit board for radio by the printed circuit board design device according to a second embodiment and one example of a process of making an exaggeration display of the wiring having the designated attribute information.

In the following, an actual process of affixing a signal wire name will be described with reference to FIG. 8 and FIG. 9. First, as shown in FIG. 8(A), the whole of a transmitter radio portion is designated as an area and a list of candidates of the attribute information related to the area is displayed on the screen of display portion 5. Here, by selecting the attribute information "TXI", the attribute information "TXI" is affixed to the wiring L1 and L2 as a signal wire name.

Next, the wiring (shown as L1 in the diagram) connecting a local oscillator and a frequency converter is selected and the attribute information "Lo 1" which shows to this wiring that this wiring is the wiring of a first local oscillator is selected from the above list. Similarly, the attribute information "FILIIN" which shows to the wiring (shown as L2 in the diagram) connecting a power amplifier and a multiplexer that this wiring is an input of "FILI" is selected from said list as shown in FIG. 8(B). By going through the above process, for L1 as shown in FIG. 9(B), the attribute information "L1" is added to the attribute information "TX1" which was affixed at the time of a process of FIG. 8(A) and a signal wire name "TX1—Lol" is established. Similarly, for L2, a signal wire name "TX1—FILIN" is affixed. These signal wire names are made into the signal wire names showing the attribute to the effect that the wiring L1 belongs to a transmitter radio portion and yet it is the wiring where the signal of a first local oscillator flows and the attribute to the effect that the wiring L2 belongs to a transmitter radio portion and yet it is the wiring where the input signal to FILI flows.

Next, the wiring (shown as L3 and L5 in the diagram) connecting a multiplexer and an antenna is selected. And the attribute information "ANT" which shows that this wiring is the wiring where an antenna signal flows" and the attribute information "FILIOUT" which shows that this wiring is the wiring where this wiring is an output of "FILI" are selected.

Like the wiring L3 and L4 as shown in the diagram, though the wiring is different, the signal wire name is quite the same. Therefore, as described above, an identification data to identify these wiring is automatically affixed.

Figure 9B:
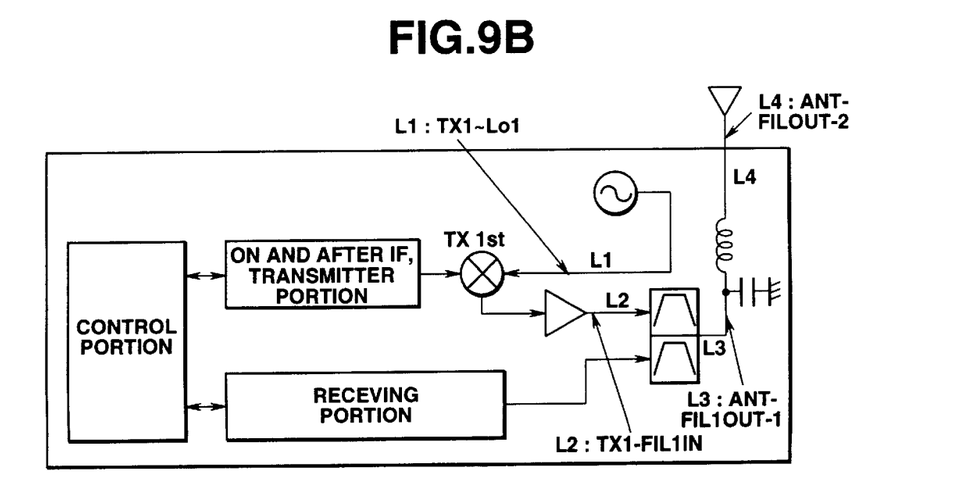

Accordingly, as shown in FIG. 9(B), the signal wire name "ANT -PIL1OUT1" is affixed to with wiring AL3 and "ANT - FIL1OUT2" is affixed to the wiring L4. These signal wire names show the attribute to the effect that [the wiring L3 and L4 are the input signal to an antenna and yet they are the wiring where the signal which is the output of "FIL1" flows]. By the above described process, the signal wire name necessary for each wiring is properly affixed as shown in FIG. 9(B).

Figure 10A:
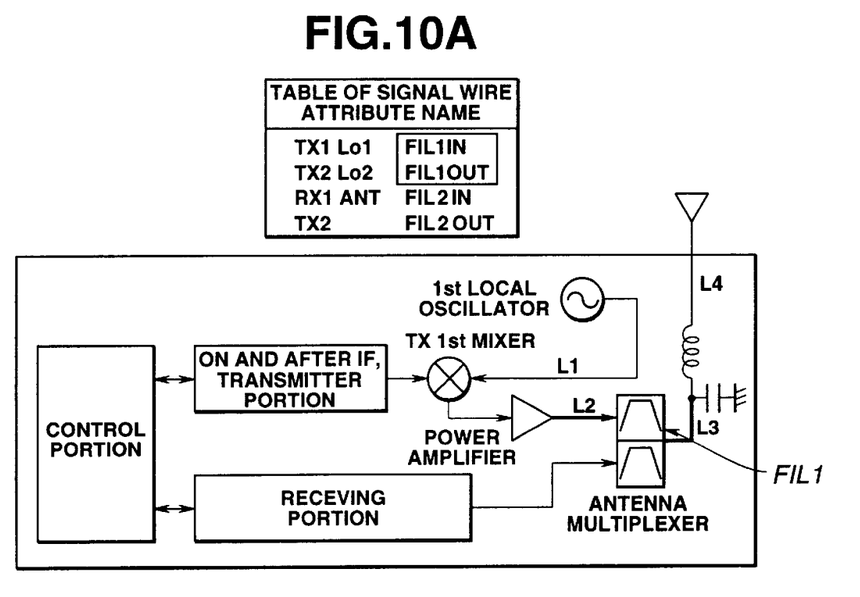
FIG. 10A–10B is a diagram, showing a process of affixing a signal wire name to the printed circuit board for radio by the printed circuit board design device according to a second embodiment and one example of processes of performing an exaggeration display of the wiring with designated attribute information.
Figure 10B:
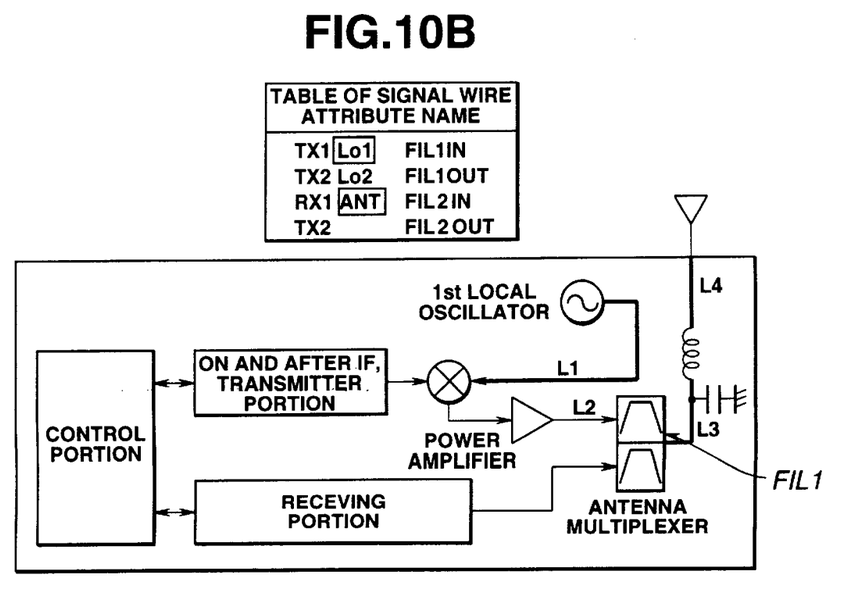

In the following, a process of an exaggeration display of the wiring of the designated information will be described with reference to FIG. 10. First, a case is described as an example where a rule to the effect that [interference between the input wiring and the output wiring of a filter should be avoided] has to be confirmed if it is observed. First, the designer inputs his desired attribute information to retrieve in retrieving attribute input portion 8. Here, since a list of the attribute information candidates is displayed by order of retrieving attribute input portion 8 as shown in FIG. 10. "FIL1IN" and "FIL1OUT" are selected from said list. By this operation, CPU 7 retrieves the wiring which includes the attribute information "FIL1IN" and "FIL1OUT". In this example, because L2 includes the attribute information "FIL1IN" and L3 includes the attribute information "FIL1OUT", these wiring are extracted as a result of retrieving.

On the basis of this result, CPU 7 performs an exaggeration display of L2 and L3 as shown in FIG. 10(A). By this operation, the designer can confirm at a glance if there is any risk of causing interference because the wiring between the input and the output of a filter is too close. Also, a rule to the effect that [interference between the wiring of a transmitter first local oscillator and the wiring of an antenna should be avoided] can similarly be confirmed. That is to say, by designating the attribute information "TX1" and "Lo 1" from retrieving attribute input portion 8, the wiring having the signal wire name including these attribute information can be extracted and shown in exaggeration display as shown in FIG. 10(B). In the case of FIG. 10(B), the wiring L1, L3, L4 are shown in exaggeration display, but in this case, because the wiring L1 and L3 are close together, a forecast can easily be made that there is every possibility that these wiring interfere with each other and therefore will cause a local leak.

According to a second embodiment, since the attribute information candidates to be affixed to the wiring constituting a circuit of the printed circuit board are memorized in attribute table 9, the designer can affix to each wiring the signal wire name comprising the attribute information by selecting only those to be affixed from these attribute information. And, comparing to a first embodiment as shown in FIG. 1, the operation for affixing the signal wire name comprising the attribute information can more effectively be performed. Also, in the case that the wiring having a possibility of causing interference problem is to be retrieved, a list based on the attribute information memorized in attribute table 9 can be displayed and, merely by selecting the desired attribute information from said list, the above retrieving can be performed. Thus, there is every advantage that the retrieving work can more effectively be made, comparing to a first embodiment as shown in FIG. 10.

While, according to a second embodiment, a list of the attribute information to be displayed when the signal wire name is to be affixed to the wiring is treated identical with a list used for retrieving the wiring from the attribute information, but an embodiment treating it as other list can be constituted.

In this case, a list of the attribute information to be displayed when the signal wire name is to be affixed to the wiring is tabulated as a list by each and every circuit. That is to say, it is divided into a list for transmitter radio portion, a list for receiver radio portion, a list for pre-amplifier portion, a list for modulation portion and a list for demodulation portion and, by inputting a circuit name or by searching for a list of circuits and selecting a desired circuit name after displaying the list, a list of the attribute information corresponding to the desired circuit name is displayed. In other example of the list of the attribute information to be displayed when the signal wire name is to be affixed to the wiring, the signal wire names are disposed in alphabetical order and selection can be made by scrolling the signal wire names in that list.

The list wherein a wiring is to be retrieved from the attribute information corresponds to the layout data on the layout screen displayed in display portion 5. That is to say, when the signal wire name comprising the attribute information is affixed to the wiring, the data related to the wiring of the layout data is made to correspond with the signal wire name comprising the attribute information. So, the data of the attribute information corresponding to the layout data on the layout screen displayed in display portion 5 is extracted from signal wire name list 102 and displayed as a list. By this manner, a list of the attribute information alone disposed and related to the layout screen displayed in display portion 5 is displayed instead of a list disposing a vast amount of the attribute information, thus helping selection work to be made easily and efficiently. Needless to mention, the list displayed when the wiring is to be retrieved from the attribute information disposes the attribute information in alphabetical order and it may be alright to select the signal wire name in the list by scrolling.

Further, when the signal wire name is to be affixed to the wiring, the attribute information can be input by character input. When the wiring is to be retrieved from the attribute information, the attribute information can be input from the list. Conversely, when the signal wire name is to be affixed to the wiring, the attribute information can be selected form the list. When the wiring is to be retrieved from the attribute information, the attribute information can be input by character input.

What is claimed is:

1. A printed circuit board design apparatus for designing a printed circuit board having a plurality of electrical circuits for performing electrical functions, the electrical circuits being formed of a plurality of wirings, the design apparatus comprising:

display means for displaying the electrical circuits being formed of the wirings and the wirings with their signal wire names;

wiring selection means for selecting at least one of the plurality of wirings of the electrical circuits shown in the display means;

attribute input means for inputting an attribute indicating which electrical circuit a selected wiring belongs to; and     naming means for generating a signal wire name for the wiring selected by the wiring selection means, the signal wire name being generated from the attribute inputted by the attribute input means.

2. The printed circuit board design apparatus according to claim 1, wherein:

the naming means generates a signal wire name by connecting each inputted attribute in serial form if the attribute input means inputs a plurality of attributes for one wiring.

3. A printed circuit board design apparatus for designing a printed circuit board having a plurality of electrical circuits for performing electrical functions, the electrical circuits being formed of a plurality of wirings, the design apparatus comprising:

- display means for displaying the electrical circuits being formed of the wirings and the wirings with their signal wire names;
- wiring selection means for selecting at least one of the plurality of wirings of the electrical circuits shown in the display means;
- attribute information memory means for storing a candidate group of attributes that indicate which electrical circuit a selected wiring belongs to;
- attribute display means for displaying the candidate group of attributes stored in the attribute information memory means;
- attribute selection means for selecting a desired attribute from the candidate group of attributes shown in the attribute display means; and
- naming means for generating a signal wire name for a wiring selected by the wiring selection means, the signal wire name being generated from the desired attribute selected by the attribute selection means.

4. A printed circuit board design apparatus for designing a printed circuit board having a plurality of electrical circuits for performing electrical functions, the electrical circuits being formed of a plurality of wirings, the design apparatus comprising:

- display means for displaying the electrical circuits being formed of the wirings and the wirings with their signal wire names;
- wiring data memory means for storing layout data of the wirings and the signal wire names of the wirings;
- attribute input means for inputting attributes of the wirings shown by the display means;
- retrieving means for retrieving wirings having a signal wire name including at least one attribute inputted by the attribute input means, the retrieving means using the layout data and the signal wire names stored in the wiring data memory means; and
- retrieved result display means for displaying the wirings retrieved by the retrieving means.

5. The printed circuit board design apparatus according to claim 4, further comprising:

- wiring selection means for selecting at least one of the plurality of wirings of the electrical circuits shown in the display means;
- circuit attribute input means for inputting a circuit attribute indicating which electrical circuit a selected wiring belongs to; and
- naming means for generating a signal wire name for the wiring selected by the wiring selection means, the signal wire name being generated from the circuit attribute inputted by the circuit attribute input means.

6. A printed circuit board design apparatus for designing a printed circuit board having a plurality of electrical circuits for performing electrical functions, the electrical circuits being formed of a plurality of wirings, the design apparatus comprising:

- display means for displaying the electrical circuits being formed of the wirings and the wirings with their signal wire names;
- wiring data memory means for storing layout data of the wirings and the signal wire names of the wirings;
- retrieving attribute memory means for storing a candidate group of retrieved attributes of the wirings shown in the display means;
- candidate group display means for displaying the stored candidate group of retrieved attributes of the wirings;
- retrieved attribute selection means for selecting a desired attribute from the candidate group of attributes shown in the candidate group display means;
- retrieving means for retrieving a wiring having a signal wire name including at least one attribute selected by the retrieved attribute selection means, the wiring being retrieved from the wirings of the electrical circuits shown in the display means; and
- retrieved result display means for displaying the wirings retrieved by the retrieving means.

7. The printed circuit board design apparatus according to claim 6, further comprising:

- wiring selection means for selecting at least one of the plurality of wirings of the electrical circuits shown in the display means;
- attribute information memory means for storing a candidate group of attributes indicating which electrical circuit the selected wiring belongs to;
- attribute display means for displaying the candidate group of attributes stored in the attribute information memory means;
- attribute selection means for selecting a desired attribute from the candidate group of attributes shown in the display means; and
- naming means for generating a signal wire name for one wiring selected by the wiring selection means, the signal wire name being generated from the desired attribute selected by the attribute selection means.

8. A printed circuit board design apparatus for designing a printed circuit board having a plurality of electrical circuits for performing electrical functions, the electrical circuits being formed of a plurality of wirings, the design apparatus comprising:

- a display;
- wiring selection means for selecting at least one of the plurality of wirings shown in the display;
- attribute input means for inputting an attribute indicating which electrical circuit a selected wiring belongs to; and
- naming means for generating a signal wire name for the wiring selected by the wiring selection means, the signal wire name being generated from the attribute inputted by the attribute input means.

9. The printed circuit board design apparatus according to claim 8, wherein:

- the naming means generates a signal wire name by connecting each inputted attribute in serial form if the attribute input means inputs a plurality of attributes for one wiring.

10. A printed circuit board design apparatus for designing a printed circuit board having a plurality of electrical circuits for performing electrical functions, the electrical circuits being formed of a plurality of wirings, the design apparatus comprising:

- a display;
- wiring selection means for selecting at least one of the plurality of wirings shown in the display;
- attribute display means for displaying a candidate group of attributes indicating which electrical circuit a selected wiring belongs to;

attribute selection means for selecting a desired attribute from the candidate group of attributes shown in the display; and naming means for generating a signal wire name for a wiring selected by the wiring selection means, the signal wire name being generated from the desired attribute selected by the attribute selection means.

11. A printed circuit board design apparatus for designing a printed circuit board having a plurality of electrical circuits for performing electrical functions, the electrical circuits being formed of a plurality of wirings, the design apparatus comprising:

attribute input means for inputting an attribute of at least one of the plurality of wirings;

retrieving means for retrieving wirings having a signal wire name including at least one attribute inputted by the attribute input means; and a display for displaying the wirings retrieved by the retrieving means.

12. The printed circuit board design apparatus according to claim 11, further comprising:

wiring selection means for selecting at least one of the plurality of wirings shown on the display;

circuit attribute input means for inputting a circuit attribute indicating which electrical circuit a selected wiring belongs to; and naming means for generating a signal wire name for the wiring selected by the wiring selection means, the signal wire name being generated from the attribute inputted by the attribute input means.

13. A printed circuit board design apparatus for designing a printed circuit board having a plurality of electrical circuits for performing electrical functions, the electrical circuits being formed of a plurality of wirings, the design apparatus comprising:

a display;

attribute selection means for selecting a desired attribute from a candidate group of attributes shown on the display; and retrieving means for retrieving a wiring having a signal wire name including at least one attribute selected by the attribute selection means, the display displaying the wirings retrieved by the retrieving means.

14. The printed circuit board design apparatus according to claim 13, further comprising:

wiring selection means for selecting at least one of the plurality of wirings shown on the display;

circuit attribute selection means for selecting a desired attribute from a candidate group of attributes indicating which electrical circuit a selected wiring belongs to shown on the display; and naming means for generating a signal wire name for one wiring selected by the wiring selection means, the signal wire name being generated from the desired attribute selected by the attribute selection means.

15. An integrated circuit layout design apparatus for designating an integrated circuit layout having a plurality of electrical circuits for performing electrical functions, the electrical circuits being formed of a plurality of wirings, the design apparatus comprising:

a display;

wiring selection means for selecting at least one of the plurality of wirings shown on the display;

attribute input means for inputting an attribute indicating which electrical circuit a selected wiring belongs to; and naming means for generating a signal wire name for the wiring selected by the wiring selection means, the signal wire name being generated from the attribute inputted by the attribute input means.

16. The integrated circuit layout design apparatus according to claim 15, wherein:

the naming means generates a signal wire name by connecting each inputted attribute in serial form if the attribute input means inputs a plurality of attributes for one wiring.

17. The integrated circuit layout design apparatus according to claim 15, further comprising:

attribute selection means for selecting a desired attribute from a candidate group of attributes shown on the display, the signal wire name being generated from the desired attribute selected by the attribute selection means.

18. An integrated circuit layout design apparatus for designing an integrated circuit layout having a plurality of electrical circuits for performing electrical functions, the electrical circuits being formed of a plurality of wirings, the design apparatus comprising:

attribute input means for inputting an attribute of the wirings;

retrieving means for retrieving wirings having a signal wire name including at least one attribute inputted by the attribute input means; and a display for displaying the wirings retrieved by the retrieving means.

19. The integrated circuit layout design apparatus according to claim 18, further comprising:

wiring selection means for selecting at least one of the plurality of wirings shown on the display;

circuit attribute input means for inputting a circuit attribute indicating which electrical circuit a selected wiring belongs to; and naming means for generating a signal wire name for the wiring selected by the wiring selection means, the signal wire name being generated from the circuit attribute inputted by the circuit attribute input means.

20. An integrated circuit layout design apparatus for designing an integrated circuit layout having a plurality of electrical circuits for performing electrical functions, the electrical circuits being formed of a plurality of wirings, the design apparatus comprising:

a display;

attribute selection means for selecting a desired attribute from the candidate group of attributes shown on the display; and retrieving means for retrieving a wiring having a signal wire name including at least one attribute selected by the attribute selection means, the display displaying the wiring retrieved by the retrieving means.

21. The integrated circuit layout design apparatus according to claim 20, further comprising:

wiring selection means for selecting at least one of the plurality of wirings shown in the display;

circuit attribute selection means for selecting a desired attribute from a candidate group of attributes indicating which electrical circuit a selected wiring belongs to shown on the display; and naming means for generating a signal wire name for one wiring selected by the wiring selection means, the signal wire name being generated from the desired attribute selected by the attribute selection means.

22. A method of designing a printed circuit board having a plurality of electrical circuits for performing electrical functions, the electrical circuits being formed of a plurality of wirings, the method comprising the steps of:
    selecting at least one of the plurality of wirings shown on a display;
    inputting an attribute indicating which electrical circuit the selected wiring belongs to; and
    generating a signal wire name for the selected wiring, the signal wire name being generated from the inputted attribute.

23. The method of claim 22, wherein the signal wire name is generated by connecting each inputted attribute in serial form in case of inputting a plurality of attributes for one wiring.

24. A method of designing a printed circuit board having a plurality of electrical circuits for performing electrical functions, the electrical circuits being formed of a plurality of wirings, the method comprising the steps of:
    selecting at least one of the plurality of wirings shown on a display;
    selecting a desired attribute from a candidate group of attributes indicating which electrical circuit a selected wiring belongs to shown on the display; and
    generating a signal wire name for the selected wiring, the signal wire name being generated from the selected attribute.

25. A method of designing a printed circuit board having a plurality of electrical circuits for performing electrical functions, the electrical circuits being formed of a plurality of wirings, the method comprising the steps of:
    inputting an attribute of the wirings;
    retrieving wirings having a signal wire name including at least one inputted attribute; and
    displaying retrieved wirings.

26. The method of claim 25 further comprising the steps of:
    selecting at least one of the plurality of wirings shown on a display;
    inputting an attribute indicating which electrical circuit the selected wiring belongs to; and
    generating a signal wire name for the selected wiring, the signal wire name being generated from the inputted attribute.

27. A method of designing a printed circuit board having a plurality of electrical circuits for performing electrical functions, the electrical circuits being formed of a plurality of wirings, the method comprising the steps of:
    displaying a candidate group of attributes indicating which of the electrical circuits a selected wiring belongs to;
    selecting a desired attribute from the candidate group of attributes shown on a display;
    retrieving wirings having a signal wire name including at least one selected attribute; and
    displaying retrieved wirings.

28. A method of designing an integrated circuit layout having a plurality of electrical circuits for performing electrical functions, the electrical circuits being formed of a plurality of wirings, the method comprising the steps of:
    selecting at least one of the plurality of wirings shown on a display;
    inputting an attribute indicating which electrical circuit the selected wiring belongs to; and
    generating a signal wire name for the selected wiring, the signal wire name being generated from the inputted attribute.

29. The method of claim 28, wherein the signal wire name is generated by connecting each inputted attribute in serial form in case of inputting a plurality of attributes for one wiring.

30. A method of designing an integrated circuit layout having a plurality of electrical circuits for performing electrical functions, the electrical circuits being formed of a plurality of wirings, the method comprising the steps of:
    selecting at least one of the plurality of wirings shown on a display;
    selecting a desired attribute from a candidate group of attributes indicating which of the electrical circuits the selected wiring belongs to shown on the display; and
    generating a signal wire name for the selected wiring, the signal wire name being generated from the selected attribute.

31. A method of designing an integrated circuit layout having a plurality of electrical circuits for performing electrical functions, the electrical circuits being formed of a plurality of wirings, the method comprising the steps of:
    inputting an attribute of the wirings;
    retrieving wirings having a signal wire name including at least one inputted attribute; and
    displaying retrieved wirings.

32. The method of claim 31 further comprising the steps of:
    selecting at least one of the plurality of wirings shown on a display;
    inputting an attribute indicating which electrical circuit the selected wiring belongs to; and
    generating a signal wire name for the selected wiring, the signal wire name being generated from the inputted attribute.

33. A method of designing an integrated circuit layout having a plurality of electrical circuits for performing electrical functions, the electrical circuits being formed of a plurality of wirings, the method comprising the steps of:
    displaying a candidate group of attributes indicating which electrical circuit a selected wiring belongs to;
    selecting a desired attribute from the candidate group of attributes shown on a display;
    retrieving wirings having a signal wire name including at least one selected attribute; and
    displaying retrieved wirings.

\* \* \* \* \*